United States Patent
Muhitch et al.

(10) Patent No.: US 6,847,211 B1
(45) Date of Patent: Jan. 25, 2005

(54) APPARATUS AND METHOD FOR CALIBRATING VOLTAGE SPIKE WAVEFORMS FOR THREE-PHASE ELECTRICAL DEVICES AND SYSTEMS

(75) Inventors: Joseph M. Muhitch, Exeter, RI (US); Edward W. Wilbur, Jr., Bristol, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/652,078

(22) Filed: Aug. 26, 2003

(51) Int. Cl.[7] .............................................. G01R 35/00
(52) U.S. Cl. ...................................... 324/601; 324/511
(58) Field of Search ................................. 324/601, 511

(56) References Cited

U.S. PATENT DOCUMENTS

| | | | | | |
|---|---|---|---|---|---|
| 4,307,342 A | * | 12/1981 | Peterson | ..................... | 324/767 |
| 4,843,515 A | * | 6/1989 | Richman | ..................... | 361/58 |
| 4,926,285 A | * | 5/1990 | Reinhardt et al. | .......... | 361/230 |
| 5,463,315 A | * | 10/1995 | Grace et al. | ............. | 324/158.1 |
| 5,525,926 A | * | 6/1996 | Merritt | ........................ | 327/535 |
| 5,537,044 A | * | 7/1996 | Stahl | ........................... | 324/511 |
| 5,623,215 A | * | 4/1997 | Maytum | ..................... | 324/765 |
| 5,956,223 A | * | 9/1999 | Banting | ...................... | 361/117 |
| 6,088,209 A | * | 7/2000 | Sink | ............................ | 361/111 |
| 6,118,639 A | * | 9/2000 | Goldstein | .................... | 361/55 |
| 6,304,839 B1 | * | 10/2001 | Ho et al. | ...................... | 703/18 |
| 6,490,143 B1 | * | 12/2002 | Estrela et al. | ............... | 361/113 |

* cited by examiner

*Primary Examiner*—Charles H. Nolan, Jr.
(74) *Attorney, Agent, or Firm*—James M. Kasischke; James M. Kasischke; Michael F. Oglo

(57) ABSTRACT

An apparatus and method for calibrating three-phase voltage spike waveforms used in testing three-phase electrical devices. The apparatus includes a circuit having a plurality of phase voltage lines and a ground line. Phase voltage outputs and a ground output are provided for connection to a device under test. A selection circuit selects one of the phase voltage lines and provides a synchronization voltage signal based on the other lines. A voltage spike generator is joined to the selection circuit for generating a voltage spike waveform synchronized with the voltage signal. Additional circuitry is joined to the voltage spike generator, the phase voltage lines and the outputs which applies the voltage spike waveform across the selected phase voltage line and the ground line.

10 Claims, 3 Drawing Sheets ically do not perform tests or evaluations on the compatibility and survivability characteristics of COTS electrical devices. Typical current methodologies and schemes for testing electrical devices and voltage spike suppression are described in Peterson U.S. Pat. No. 4,307,342, Grace et al. U.S. Pat. No. 5,463,315, Merritt U.S. Pat. No. 5,525,926, Maytum U.S. Pat. No. 5,623,215 and Sink U.S. Pat. No. 6,088,209. However, these methodologies and schemes do not provide efficient techniques for testing the compatibility and survivability characteristics of three-phase electrical devices. Thus, what is needed is an apparatus and method that can efficiently and inexpensively test the compatibility and survivability characteristics of three-phase electrical devices and systems.

APPARATUS AND METHOD FOR CALIBRATING VOLTAGE SPIKE WAVEFORMS FOR THREE-PHASE ELECTRICAL DEVICES AND SYSTEMS

CROSS-REFERENCE TO RELATED PATENT APPLICATIONS

This patent application is co-pending with one related patent application Ser. No. 10/652,079 entitled APPARATUS AND METHOD FOR CALIBRATING VOLTAGE SPIKE WAVEFORMS, by the same inventor as this application.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention generally relates to an apparatus and method for calibrating voltage spike waveforms that are used to test survivability and compatibility of three-phase electrical devices and systems.

(2) Description of the Prior Art

Many military and commercial-off-the-shelf ("COTS") three-phase electrical devices have specifications that are incomplete with regard to compatibility and survivability. This problem is exacerbated when these electrical devices are integrated with devices configured in accordance with military specifications such as onboard electronics on a submarine or other naval vessels. Vendors typ-

SUMMARY OF THE INVENTION

It is therefore an object of the present invention to provide an apparatus and method for calibrating voltage spike waveforms that are used to test the survivability and compatibility characteristics of three-phase electrical devices and systems.

It is another object of the present invention that the aforesaid apparatus and method be relatively inexpensive to implement.

Other objects and advantages of the present invention will be apparent from the ensuing description.

Thus, the present invention is directed to, in one aspect, an apparatus for calibrating voltage spikes used in testing electrical devices, comprising a circuit having a plurality of phase voltage lines and a ground line, a plurality of phase voltage inputs and a ground input adapted for connection to a power source. Each phase voltage input is connected to a corresponding phase voltage line and the ground input is connected to the ground line. The circuit further comprises a plurality of phase voltage outputs and a ground output adapted for connection to an electrical device under test. Each phase voltage output is connected to a corresponding phase voltage line and the ground output is connected to the ground line. The apparatus further comprises a selection circuit for selecting one of the phase voltage lines and for providing a synchronization voltage signal based on voltage signals across the phase voltage lines not selected by the selection circuit, a voltage spike generator for generating a predetermined voltage spike waveform based on the synchronization voltage signal, and additional circuitry for applying the predetermined voltage spike waveform across the selected phase voltage line and the ground line.

In a related aspect, the present invention is directed to a method for calibrating voltage spikes used in testing electrical devices, comprising providing a three-phase electrical device to be tested, providing a three-phase power source, providing a circuit having a plurality of phase voltage lines and a ground line, connecting the phase voltage lines between the three phase power source and the electrical device under test, selecting one of the phase voltage lines, generating a synchronization voltage signal based on the voltage signal across the phase voltage lines not selected, generating a voltage spike waveform based on the synchronization voltage signal wherein the voltage spike waveform has variable waveform characteristics, and applying the voltage spike waveform across the selected phase voltage line and the ground line. The waveform characteristics of the voltage spike waveform can be varied to conform to specific testing requirements for testing the electrical device under test.

BRIEF DESCRIPTION OF THE DRAWINGS

The foregoing features of the present invention will become more readily apparent and may be understood by referring to the following detailed description of an illustrative embodiment of the present invention, taken in conjunction with the accompanying drawings, in which.

DESCRIPTION OF THE PREFERRED EMBODIMENTS

Figure 1:
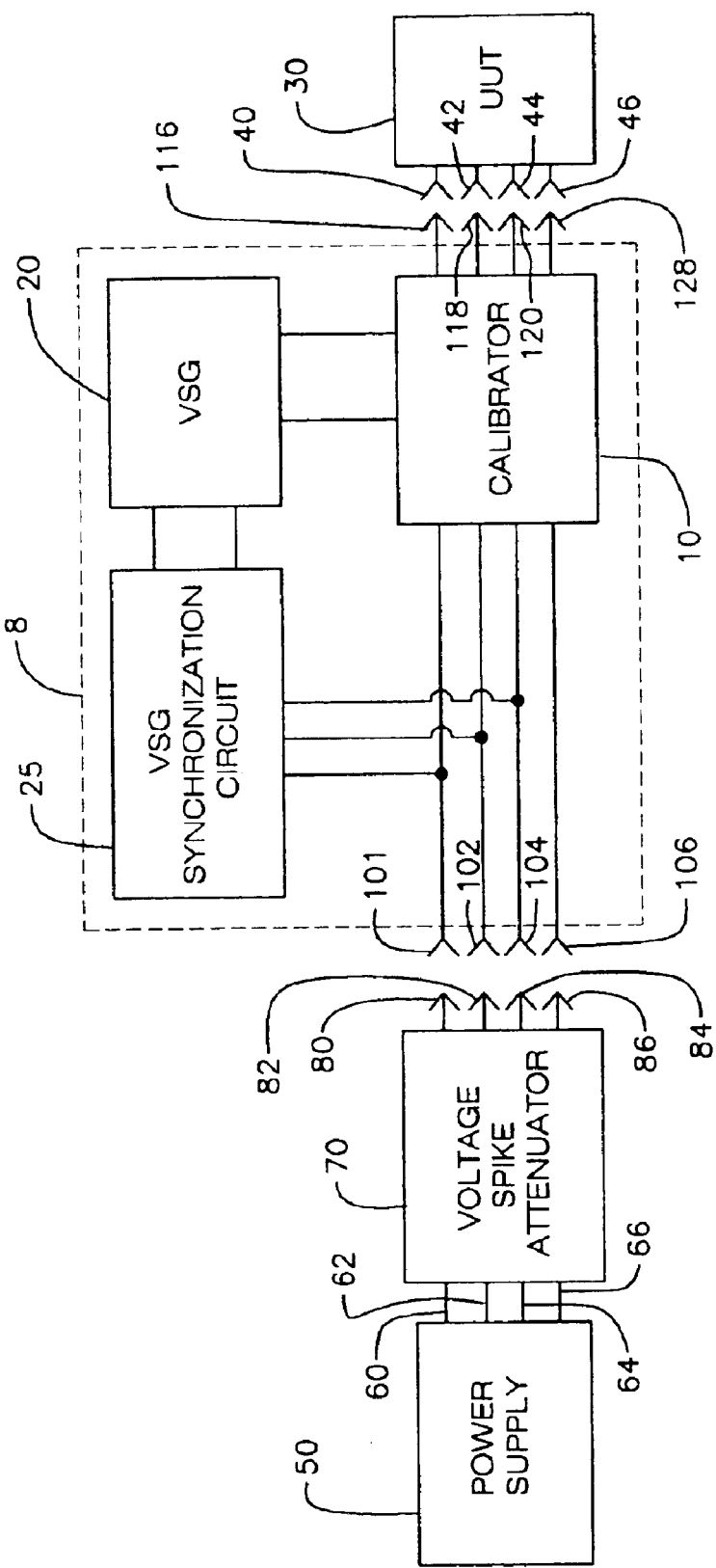
FIG. 1 is a block diagram showing a testing system that utilizes the calibrator apparatus of the present invention.

The present invention is directed to a three-phase voltage spike waveform calibrator for implementing voltage spike tests on three-phase electrical devices and equipment under test. Referring to FIG. 1, there is shown a testing system that utilizes voltage spike calibrator apparatus 8 of the present invention. Calibrator apparatus 8 generally comprises calibrator 10, voltage spike generator ("VSG") 20, and synchronization circuit 25. Calibrator 10 receives and calibrates voltage spikes and outputted by VSG 20. The voltage spikes outputted by VSG 20 are based on synchronization voltage signals provided by synchronization circuit 25. The testing system shown in FIG. 1 is used to perform particular tests on the unit under test ("UUT") 30 wherein each test requires inputting a predetermined voltage spike waveform into UUT 30. UUT 30 can be any type of three-phase electrical device or system. UUT 30 includes phase A voltage input 40, phase B voltage input 42, and phase C voltage input 44, and ground input 46. Calibrator 10 transforms the voltage spike outputted by VSG 20 into particular voltage spike waveforms that are applied to inputs 40, 42, 44 and 46 of UUT 30 in order to test the survivability and compatibility of UUT 30. This feature of the invention is described in detail in the ensuing description.

Referring to FIG. 1, power supply 50 provides a supply voltage and current to the UUT 30. Power supply 50 is configured to provide a three-phase output and includes phase A voltage output 60, phase B voltage output 62, phase C voltage output 64 and ground output 66 that are inputted into voltage spike attenuator 70. In a preferred embodiment, power supply 50 is configured to provide 115 $V_{rms}$ and 440 $V_{rms}$ in order to test UUT 30 with either voltage. In one embodiment, VSG 20 is configured to output a voltage spike having a magnitude of about 1000 volts when UUT 30 is a 115 $V_{rms}$ device, and a magnitude of about 2500 volts when UUT 30 is a 440 $V_{rms}$ device.

Referring to FIG. 1, voltage spike attenuator 70 is connected between power supply 50 and calibrator 10 and prevents high voltage spikes from being inputted into power supply 50. Voltage spike attenuator 70 includes phase A voltage line 80, phase B voltage line 82, phase C voltage line 84, and ground line 86 that are connected to corresponding phase A, phase B, and phase C voltage lines and the ground input, respectively, of calibrator 10. Voltage spike attenuator 70 is configured to attenuate the high frequency components of the voltage spike outputted by VSG 20. For example, attenuator 70 is configured to attenuate a voltage spike having a peak voltage of 1000 volts for a 115 $V_{rms}$ three-phase system so as to yield a voltage spike having a peak voltage of 300 volts. Attenuator 70 is further configured to attenuate a voltage spike having a peak voltage of 2500 volts for a 440 $V_{rms}$ three-phase system so as to yield a 700 volts voltage spike. Voltage spike attenuator 70 is well known in the art and is therefore not discussed in detail.

Referring to FIG. 1, calibrator 10 includes phase A voltage input 101, phase B voltage input 102, phase C voltage input 104, and ground input 106 that are connected to phase A voltage line 80, phase B voltage line 82, phase C voltage line 84, and ground line 86, respectively, of voltage spike attenuator 70. Calibrator 10 further comprises phase A voltage output 116, phase B voltage output 118, phase C voltage output 120 and ground line 128. Phase A voltage output 116, phase B voltage output 118, phase C voltage output 120 and ground line 128 are connected to phase A voltage input 40, phase B voltage input 42, phase C voltage input 44 and ground line 46, respectively, of UUT 30.

Figure 2:
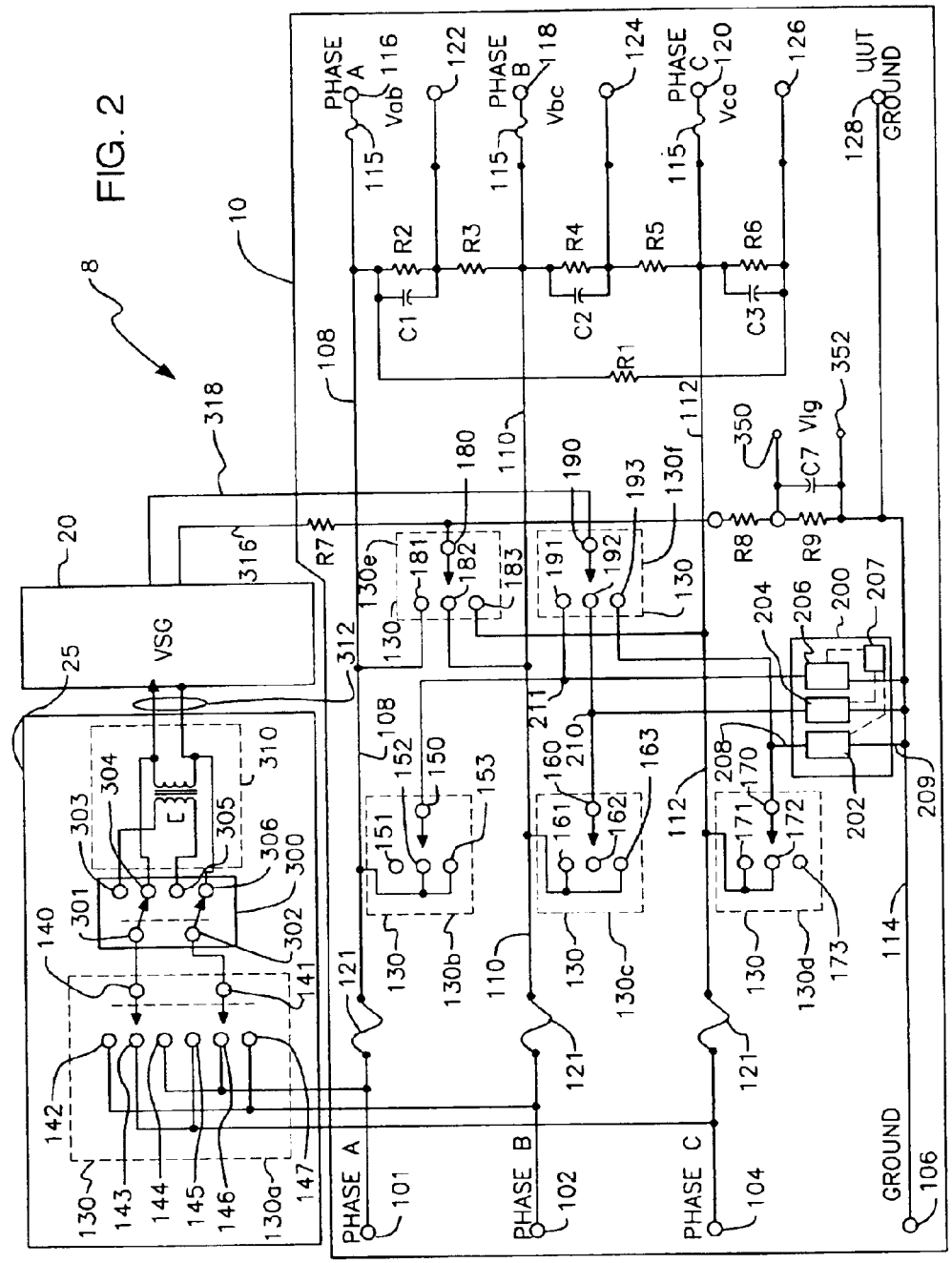
FIG. 2 is a schematic diagram of the calibrator apparatus of the present invention.

Referring to FIG. 2, calibrator 10 comprises phase A voltage line 108, phase B voltage line 110, phase C voltage line 112 and ground line 114. Phase A voltage input 101 and phase A voltage output 116 are connected to phase A voltage line 108. Phase B voltage input 102 and phase B voltage output 118 are connected to phase B voltage line 110. Phase C voltage input 104 and phase voltage output 120 are connected to phase C voltage line 112. Ground input 106 and ground output 128 are connected to ground line 114. Fuses 121 provide overload protection.

Referring to FIG. 2, calibrator 10 further comprises resistors R1, R2, R3, R4, R5 and R6 that form voltage divider circuits. In one embodiment, each resistor R2, R4 and R6 has a resistance of about 1 KΩ, and each resistor has R1, R3 and R5 has a resistance of about 99 KΩ. Each capacitor C1, C2 and C3 filters out high frequencies and in one embodiment, has a capacitance of about 27 pF (picoFarads). However, it is to be understood that other suitable resistances and capacitance values may be used. Calibrator 10 further includes voltage monitoring outputs 122, 124 and 126. Output 122 allows measurements of voltage spikes between the phase A voltage and the phase B voltage. Output 124 allows for measurement of voltage spikes between the phase B voltage and the phase C voltage. Similarly, output 126 allows for measurement of voltage spikes between the phase A voltage and the phase C voltage.

Referring to FIGS. 1 and 2, calibrator 10 and voltage synchronization circuit 25 each comprise a portion of switch 130. Switch 130 comprises a plurality of groups of switch contacts 130a, 130b, 130c, 130d, 130e and 130f. Voltage synchronization circuit 25 comprises group 130a of switch contacts. Group 130a comprises switch contacts 140, 141, 142, 143, 144, 145, 146 and 147. Contacts 140 and 141 are inputted into switch 300 which is described in the ensuing description. Switch contact 142 is connected to switch contact 147 and phase B voltage line 110. Switch contact 143 is connected to switch contact 145 and phase C voltage line 112. Switch contact 144 is connected switch contact 146 and phase A voltage line 108.

Referring to FIG. 2, calibrator 10 comprises groups 130b, 130c, 130d, 130e and 130f of switch contacts. Group 130b comprises switch contacts 150, 151, 152 and 153. Switch contact 151 is connected to an open circuit. Switch contacts 152 and 153 are connected to phase A voltage line 108. Group 130c comprises switch contacts 160, 161, 162 and 163. Switch contacts 161 and 163 are connected to phase B voltage line 110. Switch contact 162 is connected to an open circuit. Group 130d comprises switch contacts 170, 171, 172 and 173. Switch contacts 171 and 172 are connected to phase C voltage line 112. Switch contact 173 is connected to an open circuit. Group 130e comprises switch contacts 180, 181, 182 and 183. Switch contact 180 is connected at the junction of resistors R7 and R8. Switch contact 181 is connected to phase A voltage line 108. Switch contact 182 is connected to phase B voltage line 110. Switch contact 183 is connected to phase C voltage line 112. Group 130f comprises switch contacts 190, 191, 192 and 193. Switch contact 191 is connected to switch contact 150. Switch contact 192 is connected to switch contact 160. Switch contact 193 is connected to switch contact 170.

Figure 3:
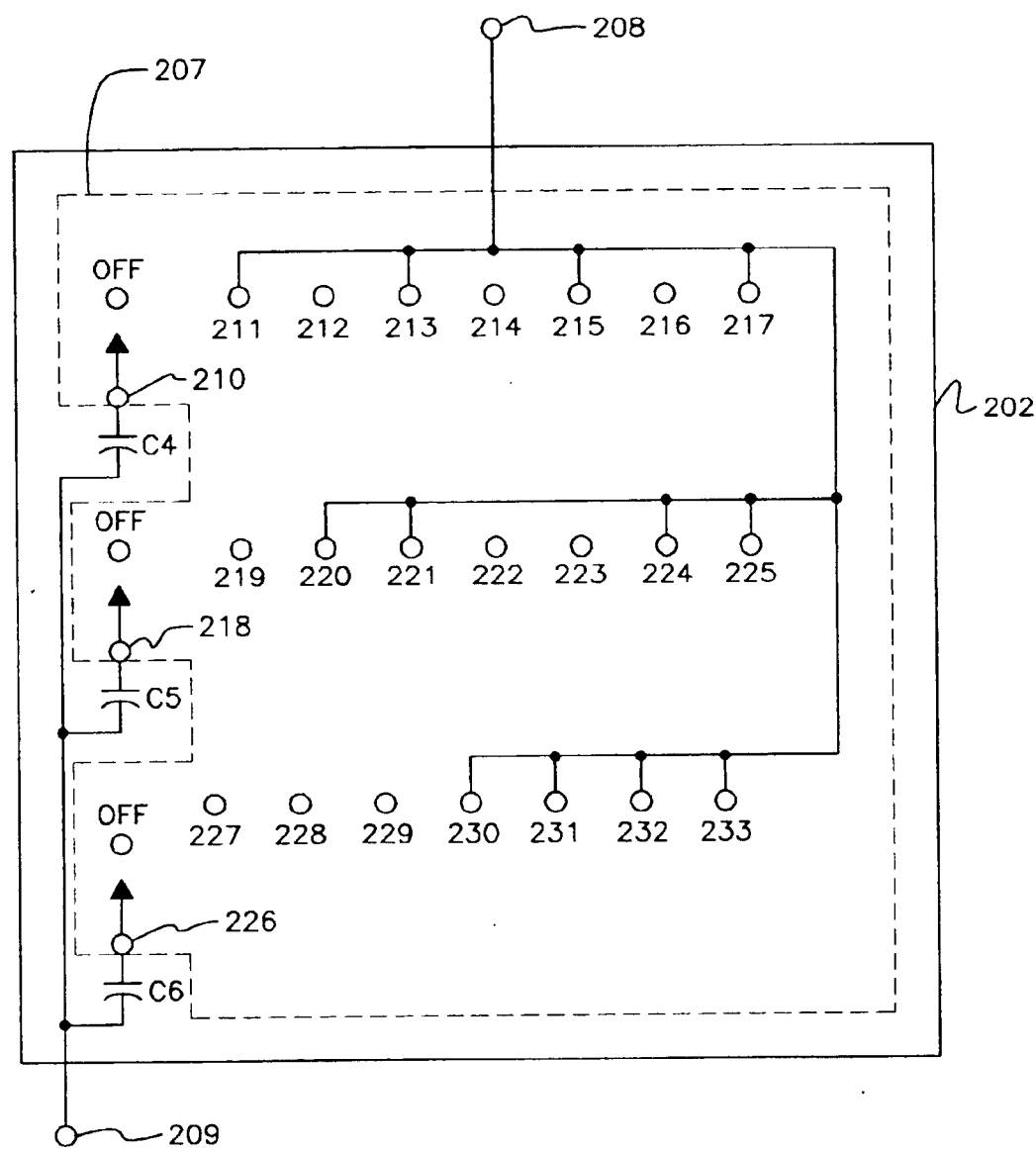
FIG. 3 is a schematic diagram of one phase of the three phase capacitor network shown in FIG. 2.

Referring to FIGS. 2 and 3, calibrator 10 further includes capacitor circuit 200 which comprises a plurality of capacitor networks 202, 204, 206 and multi-level switch 207. Capacitor network 202 is connected between switch contact 170 and ground line 114. Capacitor network 204 is connected between switch contact 160 and ground line 114. Capacitor network 206 is connected between switch contact 150 and ground line 114. Switch 207 simultaneously adjusts all capacitor networks 202, 204, 206 so that each capacitor network 202, 204 and 206 exhibits the same capacitance. Switch 207 is adjusted so that the actual capacitance exhibited by each capacitor network 202, 204 and 206 conforms to the particular testing requirements for UUT 30. In one embodiment, switch 207 is configured as a multi-deck rotary switch. However, other suitable switches can be used as well. Each capacitor network 202, 204 and 206 has the same circuit configuration which is shown in FIG. 3. For purposes of simplicity, only capacitor network 202 is described in the ensuing description. Referring to FIG. 3, capacitor network 202 includes nodes 208 and 209. Node 208 is connected to switch contacts 170 and 193. Capacitor network 204 includes nodes 209 and 210. Node 210 is connected to switch contacts 160 and 192. Capacitor network 206 includes nodes 211 and 209. Node 211 is connected to switch contacts 150 and 191. Node 209 is connected to ground line 114. Switch 207 comprises a plurality of groups of switch contacts. One of these groups of switch contacts comprises switch contacts 210 through 217. Another group of switch contacts comprises switch contacts 218 through 225. A further group of switch contacts comprises switch contacts 226 through 233. Switch contacts 212, 214 and 216 are open circuits. Switch contacts 219, 222, and 223 are also open circuits. Similarly, switch contacts 227–229 are open circuits. Capacitor network 202 comprises capacitors C4, C5, and C6. Switch 207 can be adjusted to produce a resultant capacitance between nodes 208 and 209 that is based on any one of capacitors C4, C5, and C6 by themselves or in any combination with each other. Thus, the resulting capacitance exhibited by capacitor network 202 can be any one of seven possible capacitances depending upon the setting of switch 207. The seven possible resulting capacitances are shown in Table I.

TABLE I

| Possible Resulting Capacitances |
|---|
| C4 |
| C5 |
| C6 |
| C4 + C5 |
| C4 + C6 |
| C5 + C6 |
| C4 + C5 + C6 |

In Table I, the sign "+" designates summation. In one embodiment, capacitor C4 has a capacitance of 5 μF (microFarads), capacitor C5 has a capacitance of 10 μF and capacitor C6 has a capacitance of 20 μF. Thus, in such an embodiment, the possible resulting capacitance is between 5 μF and 35 μF, inclusive. It is to be understood that capacitor networks 204 and 206 have substantially the same circuit configuration as capacitor network 202. In a preferred embodiment, switch 207 is configured so that each capacitor network 202, 204 and 206 exhibits substantially the same capacitance. A user adjusts switch 207 so that capacitor networks 202, 204 and 206 exhibit a particular capacitance that corresponds to a particular voltage spike test being performed on UUT 30.

Referring to FIG. 2, voltage synchronization circuit 25 further comprises switch 300 which has switch contacts 301, 302, 303, 304, 305 and 306. Voltage synchronization circuit 25 further includes voltage transformer 310. Voltage transformer 310 includes 440 $V_{rms}$ inputs and 115 $V_{rms}$ inputs. Switch contacts 301 and 302 are connected to switch contacts 140 and 141, respectively. Switch contacts 303 and 305 are connected to the 440 $V_{rms}$ inputs of voltage transformer 310. Transformer 310 steps 440 $V_{rms}$ down to 115 $V_{rms}$ such that it can be used for synchronization of VSG 20 when calibrator 10 is used with a 440 $V_{rms}$ three-phase electrical system. Transformer 310 outputs synchronization signal 312 which is inputted into VSG 20. Switch contacts 304 and 306 bypass transformer 310 and feed the 115 $V_{rms}$ synchronization signal 312 directly into VSG 20.

VSG 20 includes high voltage and common outputs 316 and 318, respectively. High voltage output 316 is connected to one end of resistor R7. Common output 318 is connected to switch contact 190. VSG 20 outputs a voltage spike through high voltage and common outputs 316 and 318, respectively.

Prior to conducting any test, the power requirements of UUT 30 must be evaluated so as to enable power supply 50 to be configured to provide the correct power. If UUT 30 is a 115 $V_{rms}$ system, then switch 300 is configured so that switch contacts 301 and 302 are connected to the 115 $V_{rms}$ inputs of transformer 310 via switch contacts 304 and 306. Power supply 50 is then configured to provide a 115 $V_{rms}$ output. If UUT 30 is a 440 $V_{rms}$ system, then switch 300 is configured so that switch contacts 301 and 302 are connected to the 440 $V_{rms}$ inputs of transformer 310 via switch contacts 303 and 305. For purposes of facilitating explanation and understanding of the invention, the ensuing description is in terms of switch 300 being configured for a 115 $V_{rms}$ UUT.

There are several voltage spike tests that must be performed on UUT 30 in order to accurately test the survivability and compatibility of UUT 30. In a first test, a predetermined voltage spike waveform is applied to phase A voltage input 40 and ground input 46 of UUT 30. In order to accomplish this first test, the predetermined voltage spike waveform is applied across phase A voltage line 108 and ground line 114. In a second test, a predetermined voltage spike waveform is applied to phase B voltage input 42 and ground input 46 of UUT 30. In order to accomplish this second test, a predetermined voltage spike waveform is applied across phase B voltage line 110 and ground line 114. In a third test, a predetermined voltage spike waveform is applied to phase C voltage input 44 and ground input 46 of UUT 30. In order to accomplish this third test, a predetermined voltage spike waveform is applied across phase C voltage line 112 and ground line 114. The manner in which these aforesaid tests are implemented is described in detail in the ensuing description.

In order to apply a predetermined voltage spike waveform across phase A voltage line 108 and ground line 114 to implement the first test, switch 130 is configured so that each pair of switch contacts shown in each row of Table II are electrically connected together.

TABLE II

| | |
|---|---|
| 140 | 142 |
| 141 | 145 |
| 150 | 151 |
| 160 | 161 |
| 170 | 171 |
| 180 | 181 |
| 190 | 191 |

Next, switch 207 is configured so that capacitor networks 202, 204 and 206 yield a particular capacitance that will provide the desired voltage spike waveform characteristics. As a result, contact 140 is connected to phase B voltage line 110 via contact 142, and contact 141 is connected to phase C voltage line 112 via contact 145. Thus, a voltage signal taken between phase B and C voltage lines 110 and 112, respectively, functions as the source for the synchronization signal and is fed to switches 130 and 300. This synchronization signal is outputted from switch 300 (via transformer 310 for 440 $V_{rms}$ systems) as signal 312 which is inputted into VSG 20. The high voltage output 316 of VSG 20 is connected to phase A voltage line 108 via switch contacts 180 and 181. The common output 318 is connected to the input of capacitor network 206 via switch contacts 190 and 191. Thus, capacitor network 206 is connected between common output 318 and ground line 114. Capacitor network 204 is connected between phase B voltage line 110, via contacts 160 and 161, and ground line 114. Capacitor network 202 is connected between phase C voltage line 112, via contacts 170 and 171, and ground line 114. The capacitance exhibited by each capacitor network 202, 204 and 206 affects the waveform characteristics of the resulting voltage spike outputted via high voltage and common outputs 316 and 318, respectively. Thus, the capacitance exhibited by each capacitive network 202, 204 and 206 introduces the proper impedance to produce the desired waveform characteristics of the voltage spike waveform that is inputted into the phase A voltage input 40 of UUT 30.

In order to apply a predetermined voltage spike waveform across phase B voltage line 110 and ground line 114 to implement the second test, switch 130 is configured so that each pair of switch contacts shown in each row of Table III are electrically connected together.

TABLE III

| | |
|---|---|
| 140 | 143 |
| 141 | 146 |
| 150 | 152 |
| 160 | 162 |
| 170 | 172 |
| 180 | 182 |
| 190 | 192 |

Next, switch 207 is configured so that capacitor networks 202, 204 and 206 yield a particular capacitance that provides the desired voltage spike waveform characteristics. As a result, contact 140 is connected to phase C voltage line 112, via contact 143, and contact 141 is connected to phase A voltage line 108, via contact 146. Thus, a voltage signal taken between phase A and C voltage lines 108 and 112, respectively, functions as the source for the synchronization signal and is fed to switches 130 and 300. This synchronization signal is outputted from switch 300 (via transformer 310 for 440 $V_{rms}$ systems) as signal 312 which is inputted into VSG 20. The high voltage output 316 of VSG 20 is connected to phase B voltage line 110 via switch contacts 180 and 182. The common output 318 is connected to the input of capacitor network 204 via switch contacts 190 and 192. Thus, capacitor network 204 is connected between common output 318 and ground line 114. Capacitor network 202 is connected between phase C voltage line 112, via contacts 170 and 172, and ground line 114. Capacitor network 206 is connected between phase A voltage line 108, via contacts 150 and 152, and ground line 114. The capacitance exhibited by capacitor networks 202, 204 and 206 affect the waveform characteristics of the resulting voltage spike outputted via high voltage and common outputs 316 and 318, respectively. Thus, the capacitance exhibited by each capacitive network 202, 204 and 206 introduces the proper impedance to produce the desired waveform characteristics of the voltage spike waveform that is inputted into the phase B voltage input 42 of UUT 30.

In order to apply a predetermined voltage spike waveform across phase C voltage line 112 and ground line 114 to implement the third test, switch 130 is configured so that each pair of switch contacts shown in each row of Table IV are electrically connected together.

TABLE IV

| | |
|---|---|
| 140 | 144 |
| 141 | 147 |
| 150 | 153 |
| 160 | 163 |
| 170 | 173 |
| 180 | 183 |
| 190 | 193 |

Next, switch 207 is configured so that capacitor networks 202, 204 and 206 yield a particular capacitance that provides the desired voltage spike waveform characteristics. As a result, contact 140 is connected to phase A voltage line 108, via contact 144, and contact 141 is connected to phase B voltage line 110, via contact 147. Thus, a voltage signal taken between phase A and B voltage lines 108 and 110, respectively, functions as the source for the synchronization signal and is fed to switches 130 and 300. This synchronization signal is outputted from switch 300 (via transformer 310 for 440 $V_{rms}$ systems) as signal 312 which is inputted into VSG 20. The high voltage output 316 of VSG 20 is connected to phase C voltage line 112 via switch contacts 180 and 183. The common output 318 is connected to the input of capacitor network 202 via switch contacts 190 and 193. Thus, capacitor network 202 is connected between common output 318 and ground line 114. Capacitor network 204 is connected between phase B voltage line 110, via contacts 160 and 163, and ground line 114. Capacitor network 206 is connected between phase A voltage line 108, via contacts 150 and 153, and ground line 114. The capacitance exhibited by capacitor networks 202, 204 and 206 affect the waveform characteristics of the resulting voltage spike outputted via high voltage and common outputs 316 and 318, respectively. Thus, the capacitance exhibited by each capacitive network 202, 204 and 206 introduces the proper impedance to produce the desired waveform characteristics of the voltage spike waveform that is inputted into the phase C voltage input 44 of UUT 30.

As a result of the particular switching configuration of switch 130, when the predetermined voltage spike waveform is applied to one of the phase A, B or C voltage lines, the voltage across the other two phase voltage lines is minimal and cannot cause stress or damage to VSG 20.

Referring to FIG. 2, calibrator 10 further includes a monitoring circuit that comprises resistors R8 and R9, capacitor C7 and test ports 350 and 352. Resistors R8 and R9 are configured in a voltage divider circuit. Capacitor C7 filters out any high frequency components. Test ports 350 and 352 allow for the measurement of the line-to-ground voltage $V_{LG}$. In one embodiment, resistors R8 and R9 have resistances of about 99 KΩ and 1 KΩ, respectively, and capacitor C7 has a capacitance of about 27 pF.

The present invention provides a technique for testing the compatibility and survivability of three-phase electrical devices which is relatively more safe and efficient than prior art techniques. The present invention allows for one test set up for all required test conditions while the UUT is energized and also allows for the changing of test instrumentation while the UUT is energized. As a result, the present invention significantly reduces test set-up and reconfiguration time. The present invention allows for variation of the phase in which the voltage spike is induced. This phase variation can be performed while UUT 30 is energized. It is not necessary to de-energize, rewire circuitry, and then re-energize UUT 30 in order to adjust the phase in which the voltage spike is induced. Additional important advantages of the present invention is that it can be easily transported and integrated with the other devices and test equipment, and realized with commercially available electrical components.

The principles, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations in changes may be made by those skilled in the art without departing from the spirit of the invention. Accordingly, the foregoing detailed description should be considered exemplary in nature and not limited to the scope and spirit of the invention as set forth in the attached claims.

What is claimed is:

1. An apparatus for calibrating voltage spikes used in testing an electrical device, comprising:

a circuit having a plurality of phase voltage lines and a ground line, a plurality of phase voltage inputs and a ground input adapted for connection to a power source, each phase voltage input being connectable to a corresponding phase voltage line and the ground input being connected to the ground line, and a plurality of phase voltage outputs and a ground output adapted for connection to an electrical device under test, each phase voltage output being connected to a corresponding phase voltage line and the ground output being connected to the ground line;

a selection circuit joined to the plurality of phase voltage lines for selecting one of the phase voltage lines and providing a synchronization voltage signal based on voltage signals across the phase voltage lines not selected by the selection circuit;

a voltage spike generator joined to the selection circuit to receive the synchronization voltage signal for generating a predetermined voltage spike waveform based on the synchronization voltage signal; and additional circuitry joined to the voltage spike generator and the phase voltage lines and joined to said phase voltage outputs and said ground output for applying the predetermined voltage spike waveform across the selected phase voltage line and the ground line.

2. The apparatus according to claim 1 further comprising a capacitive circuit comprising a plurality of capacitor networks joined to the selection circuit, each capacitor network having a variable capacitance such that the capacitor network exhibits any one of a plurality of capacitances, each capacitor network corresponding to a particular phase voltage line.

3. The apparatus according to claim 2 wherein the selection circuit is configured to disconnect the capacitor network corresponding to the selected phase voltage line, connect the capacitor network corresponding to one of the phase voltage lines not selected to the ground line, connect a further one of the capacitor networks corresponding to the remaining phase voltage line not selected to the ground line, and wherein the phase voltage lines that are not selected provide a voltage signal that defines the synchronization signal and has waveform characteristics that are formed by the capacitance exhibited by the capacitor networks corresponding to the phase voltage lines not selected.

4. The apparatus according to claim 2 wherein each capacitor network comprises:

a plurality of capacitors; and a switch joined to said plurality of capacitors for selectively activating at least one of said plurality of capacitors to provide a resulting capacitance that is to be exhibited by the capacitor network.

5. The apparatus according to claim 4 wherein when the switch selectively activates more than one of said plurality of capacitors, said selectively activated capacitors are connected in parallel.

6. The apparatus according to claim 1 further comprising a monitoring circuit joined to said voltage spike generator for monitoring the predetermined voltage spike waveform.

7. A method for calibrating voltage spikes used in testing an electrical device, comprising:

providing a three-phase electrical device to be tested;

providing a three-phase power source;

providing a circuit having a plurality of phase voltage lines and a ground line;

connecting the phase voltage lines between the three-phase power source and the electrical device under test;

selecting one of the phase voltage lines;

generating a synchronization voltage signal based on voltage signals across the phase voltage lines not selected;

generating a voltage spike waveform based on the synchronization voltage signal, the voltage spike waveform having variable waveform characteristics; and applying the voltage spike waveform across the selected phase voltage line and the ground line.

8. The method according to claim 7 further wherein the step of generating the voltage spike waveform includes the step of adjusting the waveform characteristics of the voltage spike waveform.

9. The method according to claim 8 further comprising providing a capacitive circuit having a plurality of capacitor networks, each capacitive network having a variable capacitance such that the capacitor network exhibits any one of a plurality of capacitances, each capacitor network corresponding to a particular phase voltage line, and wherein the step of adjusting comprises changing the capacitances of the capacitor networks corresponding to the phase voltage lines not selected.

10. The method according to claim 7 further comprising monitoring the predetermined voltage spike waveform.

* * * * *